United States Patent
Pennings et al.

[11] Patent Number: 5,563,968
[45] Date of Patent: Oct. 8, 1996

[54] MULTIMODE IMAGING COMPONENT AND RING LASER PROVIDED WITH A MULTIMODE IMAGING COMPONENT

[75] Inventors: Engelbertus C. M. Pennings; Raymond Van Roijen, both of Eindhoven, Netherlands

[73] Assignee: U.S. Philips Corporation, New York, N.Y.

[21] Appl. No.: 406,953
[22] PCT Filed: Aug. 2, 1994
[86] PCT No.: PCT/IB94/00231
    § 371 Date: Mar. 29, 1995
    § 102(e) Date: Mar. 29, 1995
[87] PCT Pub. No.: WO95/05020
    PCT Pub. Date: Feb. 16, 1995

[30] Foreign Application Priority Data

Aug. 4, 1993 [EP] European Pat. Off. .............. 93202298

[51] Int. Cl.$^6$ ............................. G02B 6/26; H01S 3/083
[52] U.S. Cl. .............................. 385/27; 385/15; 385/115; 385/116; 385/129; 372/94; 372/108
[58] Field of Search ................................ 385/14, 15, 27, 385/28, 49, 129, 130, 131, 115, 116, 120, 133; 372/94, 64, 98, 108

[56] References Cited

U.S. PATENT DOCUMENTS

| | | | |
|---|---|---|---|
| 3,599,019 | 8/1971 | Ito et al. ............................... | 372/94 X |
| 3,760,297 | 9/1973 | Thompson ............................. | 372/94 X |
| 3,803,511 | 4/1974 | Thompson ............................. | 372/94 X |
| 4,116,739 | 9/1978 | Glenn .................................... | 385/115 X |
| 4,525,843 | 6/1985 | Diels ..................................... | 372/94 |
| 4,871,228 | 10/1989 | Roos .................................... | 385/116 X |
| 5,469,460 | 11/1995 | Van Roijen et al. .................... | 372/94 |

FOREIGN PATENT DOCUMENTS 2506272  2/1986  Germany .............................. 372/94 X

OTHER PUBLICATIONS

"Design and Fabrication of Integrated InGaAsP Ring Lasers with MMI-outcouplers", M. J. N. Van Stralen, R. Van Roijen, E. C. M. Pennings, et al. pp. 2–24 and 2–25.

Primary Examiner—Brian Healy
Attorney, Agent, or Firm—Michael E. Marion

[57] ABSTRACT

A multimode imaging component provided with a rectangular waveguide (14') having two ends (15, 19) is described. To avoid unwanted reflections of radiation in the waveguide, the surfaces (17, 21) between the windows (16, 18, 20, 22) at the ends are provided with means for reducing reflection, for example, anti-reflection coatings (24, 25). When such a multimode imaging component is used as a coupler in a ring laser, the radiation spectrum of the ring laser will not comprise unwanted spectral components.

10 Claims, 3 Drawing Sheets

MULTIMODE IMAGING COMPONENT AND RING LASER PROVIDED WITH A MULTIMODE IMAGING COMPONENT

BACKGROUND OF THE INVENTION

1. Field of the Invention

The invention relates to a multimode imaging component for dividing or coupling radiation, comprising a waveguide having an end which is provided with at least one window for transmitting radiation into or out of the waveguide. The invention also relates to a ring laser provided with a multimode imaging component.

2. Discussion of the Related Art

A multimode imaging component is also known as multimode interference component and multimode waveguide. The term "multimode imaging" will hereinafter be abbreviated to MMI.

An MMI component is known, inter alia from German Patent Specification DE 25 06 272. This component is very suitable for use as a radiation divider or coupler in integrated optical systems due to its satisfactory suitability for integration with other components, wide manufacturing tolerances, insensitivity to polarization and radiation wavelength, low radiation losses and versatility.

An application of an MMI component is disclosed in the article "Design and fabrication of integrated InGaAsP ring lasers with MMI outcouplers" by M. J. N. van Stralen et al on pp. 2-24 and 2-25 of the conference report of the ECIO '93 in Neuchâtel, Switzerland. The MMI component is used in this application for coupling radiation from a ring laser to two output waveguides. The MMI component has two ends each provided with two windows and is arranged in the ring laser in such a way that the MMI component is part of the laser ring in which the radiation is generated. The radiation of the laser ring is passed to the output waveguides via two windows, one at each end. The ring laser, comprising the laser ring, the MMI component and the waveguide, is integrated on a single substrate.

A drawback of this known construction is that the spectrum of the radiation in the output waveguides does not comprise only the desired laser mode of the ring laser under all circumstances, but also a multitude of other, unwanted spectral components.

SUMMARY OF THE INVENTION

It is an object of the invention to provide, inter alia an MMI component which does not have the above mentioned problem.

This object is achieved by an MMI component as described in the opening paragraph, which MMI component according to the invention is characterized in that the part of the end located outside the window is provided with means for reducing reflection of radiation in the direction of the longitudinal axis of the waveguide.

The invention is based on the newly gained recognition that the problems of the known ring laser are caused by reflection of radiation within the MMI component on those parts of the two ends which are located outside the windows. The relevant parts reflect the incident radiation in the direction of the longitudinal axis of the MMI waveguide so that a standing wave may be produced between the two ends. For said application in the ring laser, the internal space of the MMI waveguide is filled with a laser-active medium, with the two ends constituting the mirrors of a resonant cavity. The radiation generated in this resonant cavity leads to the unwanted spectral components in the output waveguides of the ring laser. By reducing the reflections at the ends, there will be less laser action in the resonant cavity and the unwanted spectral components are smaller.

Also in applications of the MMI component in which the waveguide does not comprise any laser-active medium, the measure according to the invention can be used to great advantage, for example, for reducing internal reflections which lead to an unwanted distribution of radiation across input and output waveguides.

The means for reducing reflection preferably comprise an anti-reflection coating, a radiation-absorbing coating, a diffuse scattering face or an oblique face which guides the reflected radiation into a direction where it does not disturb the desired radiation distribution.

It is to be noted that FIG. 16 of said German Patent Specification shows MMI components having oblique faces at the ends. However, these faces are the windows and they are not areas between the windows. In the MMI components shown the windows cover the entire surface of the ends. Moreover, the oblique faces do not have the function of reducing the reflection in the direction of the longitudinal axis of the waveguide.

BRIEF DESCRIPTION OF THE DRAWINGS

These and other aspects of the invention will be apparent from and elucidated with reference to the embodiments described hereinafter.

In the drawings

DETAILED DESCRIPTION OF THE PREFERRED EMBODIMENTS

Figure 1:
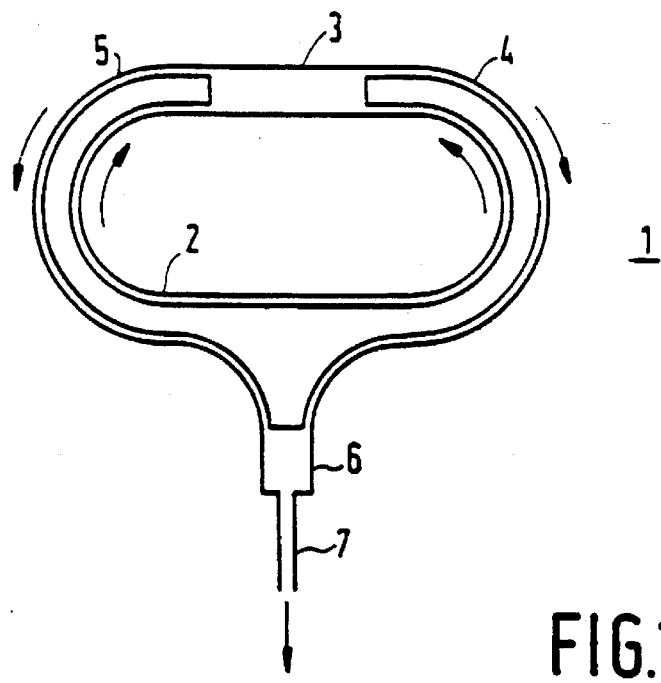
FIG. 1 shows a known ring laser.

FIG. 1 shows a ring laser 1 as is known from, inter alia said article "Design and fabrication of integrated InGaAsP ring lasers with MMI outcouplers", in which the entire output power is available in a single waveguide. The laser radiation is generated in an annular waveguide, i.e. a laser ring 2, in which two radiation beams travel in opposite directions. An MMI coupler 3 couples a part of the radiation beams out of the laser ring 2 to the waveguides 4 and 5. An MMI combiner 6 combines the radiation of the waveguides 4 and 5 in an output waveguide 7. The ring laser 1 is integrated in a semiconductor structure. The entire area occupied by the components 2–7 is laser-active, i.e. if a resonant cavity complying with given resonance criteria is present in the area, laser radiation will be generated in this resonant cavity.

Figure 2:
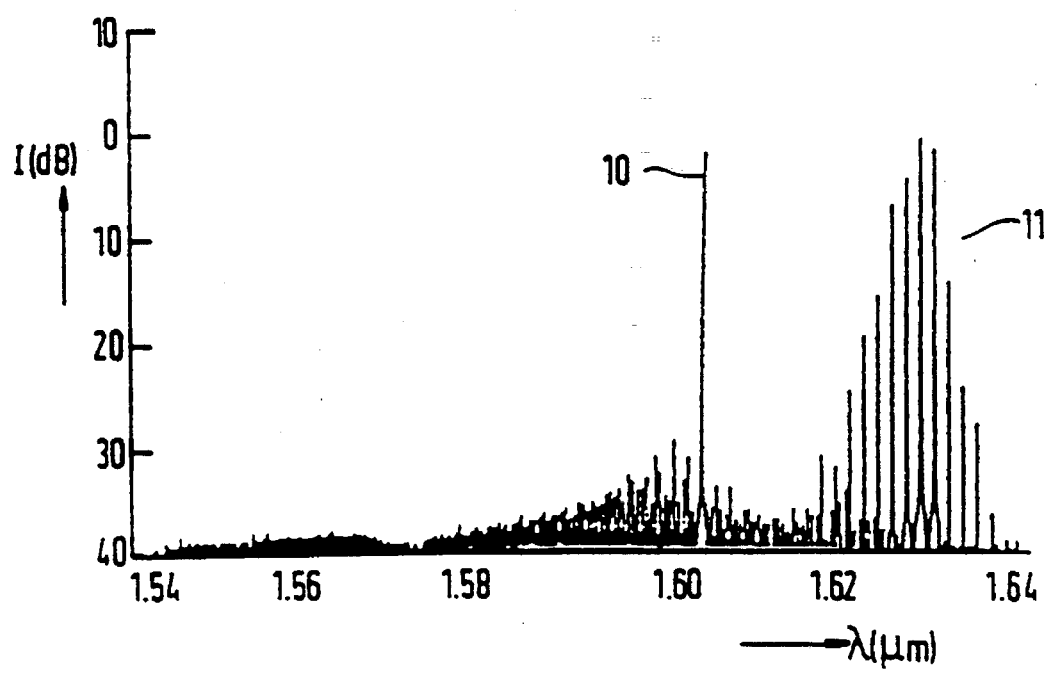
FIG. 2 shows the spectrum of the known ring laser.

FIG. 2 shows an example of a spectrum of the radiation in the output waveguide 7 of the known ring laser. The wavelength $\lambda$ is plotted in micrometers on the horizontal axis in the Figure and the intensity of the spectral components is plotted in decibels on the vertical axis. The spectrum appears to be strongly dependent on the geometry of the ring laser and on the working conditions such as the intensity of the current with which the ring laser is activated. The spectral component 10 is the desired laser mode of the ring laser. The spectral components 11 constitute unwanted radiation modi. The distance between the separate spectral components 11 corresponds to a resonant cavity length of approximately 250 µm.

Figure 3A:
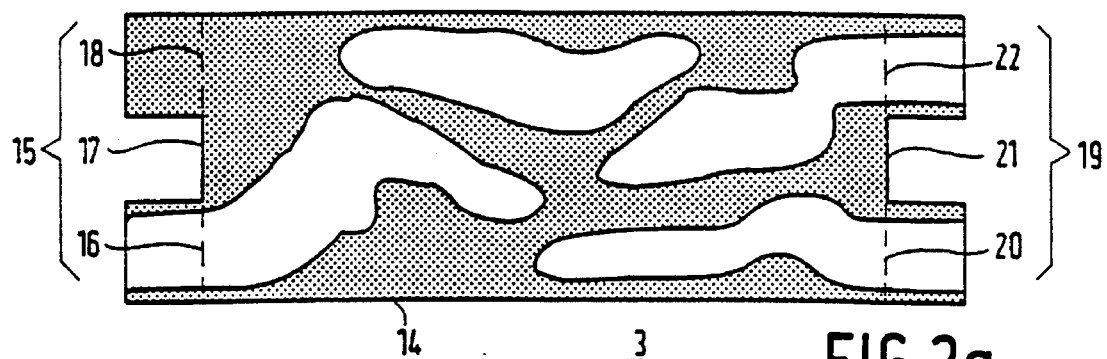
FIGS. 3a and 3b show a desired intensity distribution and an unwanted intensity distribution in a known MMI component respectively.

The generation of unwanted radiation modi in the MMI coupler 3 can be understood with reference to the intensity distributions of the radiation in such a coupler. FIG. 3a shows the intensity distribution in the rectangular MMI waveguide 14 of the coupler 3, with two ends 15, 19 each provided with windows 16, 18 and 20, 22 and with intermediate faces 17 and 21, respectively, between the windows. Since the MMI coupler and the input and output waveguides connected thereto are generally made of one and the same material, the windows are fictitious faces which indicate a boundary of the MMI waveguide 14. A typical MMI coupler suitable for radiation at a wavelength of 1.6 µm has a length of 233 µm, a width of 7 µm and an active layer thickness, perpendicular to the plane of the drawing, of 0.2 µm, while the diameter of a window at an end is 2.5 µm.

The FIG. 3a indicates the intensity distribution of the radiation for the situation where radiation from the laser ring 2 enters through window 16 of the MMI waveguide and is equally distributed across the two windows 20 and 22. In the light areas in the waveguide the radiation intensity is high, in dark areas it is low. The operation of the MMI coupler is based on the recognition that an intensity distribution in conformity with that of the radiation entering the window 16 is formed at the area of both the window 20 and the window 22 by the different transversal radiation modi passed through the waveguide with their specific propagation characteristics, dependent on the dimensions of the waveguide; in other words, the intensity distribution of the input window 16 is imaged on each of the output windows 20, 22. As a result, the radiation power entering the MMI waveguide 14 through window 16 is distributed across the two windows 20 and 22.

Figure 3B:
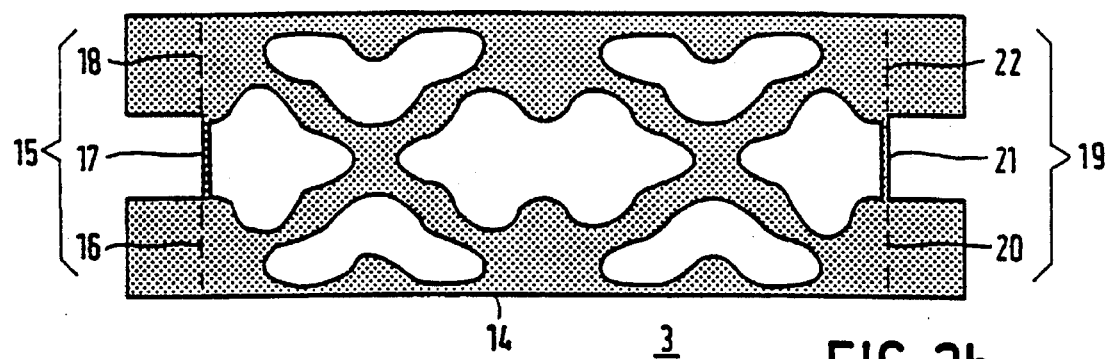

FIG. 3b shows the same MMI waveguide 14 as in FIG. 3a, but now with an unwanted intensity distribution so that unwanted guided modi are generated. The waveguide 14, operating as the coupler shown in FIG. 3a, appears to have such dimensions that the intermediate face 17 is imaged on the intermediate face 21 by the radiation modi in the waveguide. The two intermediate faces having a mutual distance of 233 µm constitute the mirrors of a resonant cavity. The reflection coefficient of such a mirror is approximately 0.30 for a resonant cavity comprising a semiconductor material surrounded by air. If the resonant cavity contains a laser-active medium, laser radiation whose intensity increases with the reflection of the intermediate faces will be generated in this resonant cavity. As a result, unwanted spectral components denoted by 11 in FIG. 2 are produced in the spectrum of the ring laser 1.

Figure 4A:
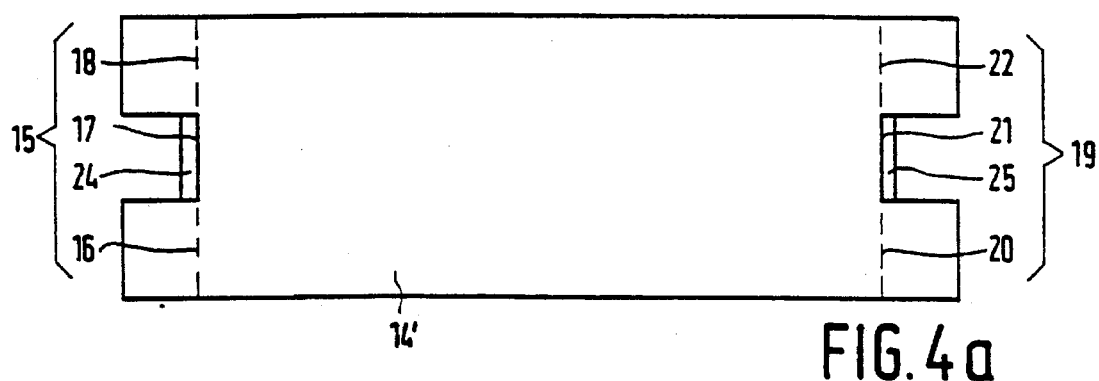
FIGS. 4a, 4b, 4c and 4d show four embodiments of the MMI coupler according to the invention.

FIG. 4a shows an MMI coupler according to the invention. The two intermediate faces 17 and 21 of the waveguide 14', i.e. the parts of the waveguide ends located outside the windows are provided with anti-reflection coatings 24 and 25, respectively. These coatings are in an area of the waveguide where the radiation intensity is low for the distribution as shown in FIG. 3a. Consequently, the anti-reflection coatings will have little influence on this distribution and the coupling function of the waveguide shown in FIG. 4a will be equal to the coupling function of the waveguide shown in FIG. 3a. The unwanted radiation distribution as shown in FIG. 3b has a high intensity at the area of the anti-reflection coatings. Consequently, the coatings have a great influence on this distribution. Since the coatings are anti-reflecting, the resonant cavity whose intermediate faces 17 and 21 constitute the mirrors will have a low quality factor so that there is considerably less laser action in this resonant cavity than in the resonant cavity shown in FIG. 3a. A ring laser provided with such an MMI coupler will thus show a spectrum mainly having the desired spectral component of the laser ring. In essence, the manufacture of such a ring laser is described in said article "Design and fabrication of integrated InGaAsP ring lasers with MMI outcouplers", where, according to the invention, two anti-reflection coatings must be added.

The provision of these coatings is only a small addition to the manufacturing process of the MMI component. The coatings may comprise, for example the material $SiO_x$ or $HfO_x$ having a thickness of a quarter wavelength. It is also possible to provide a multilayer coating on each intermediate face. The provision of the layers is simplified if they are not only provided on the ends but on the whole structure of the MMI waveguide. The anti-reflection coatings on the long sides of the waveguide hardly influence the operation of the MMI component. The anti-reflection coatings also operate as dielectric coatings around the resonant cavity, which coatings are necessary in some manufacturing processes.

Figure 4B:
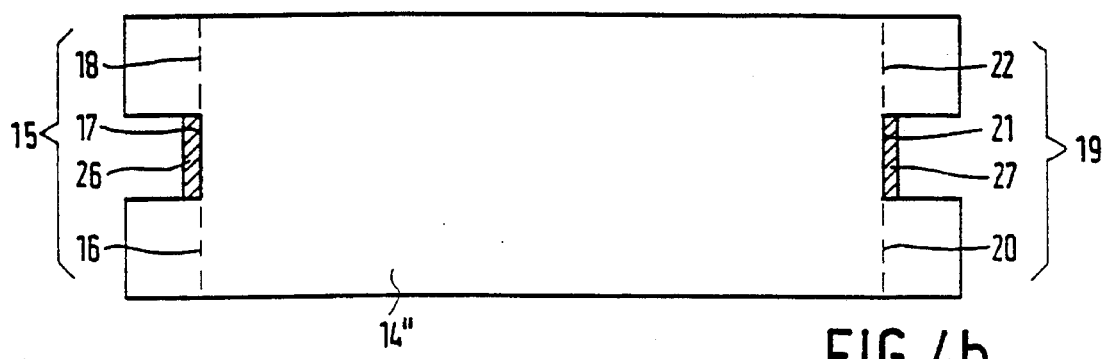

FIG. 4b shows a second embodiment of the MMI coupler according to the invention. The two intermediate faces 17 and 21 are provided with radiation-absorbing layers 26 and 27, respectively. These layers influence the unwanted radiation modi of the waveguide 14" in a way which is comparable with the anti-reflection coatings 24 and 25, so that there is considerably less laser action in the coupler. The absorbing layers may comprise, for example a layer of laser-activatable material which is not pumped.

Figure 4C:
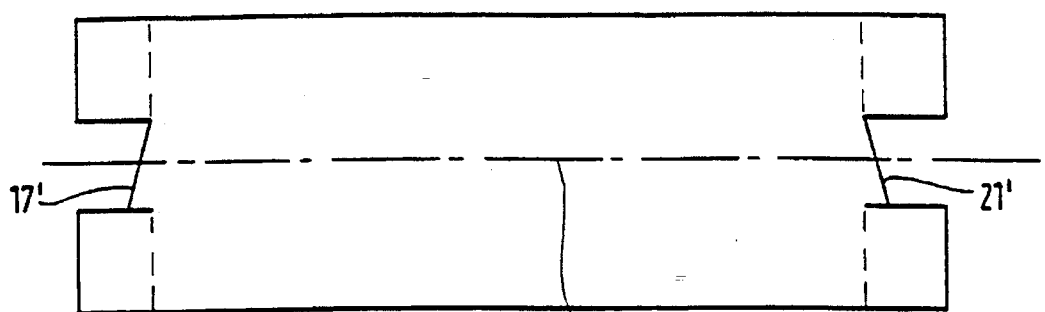
Figure 4D:
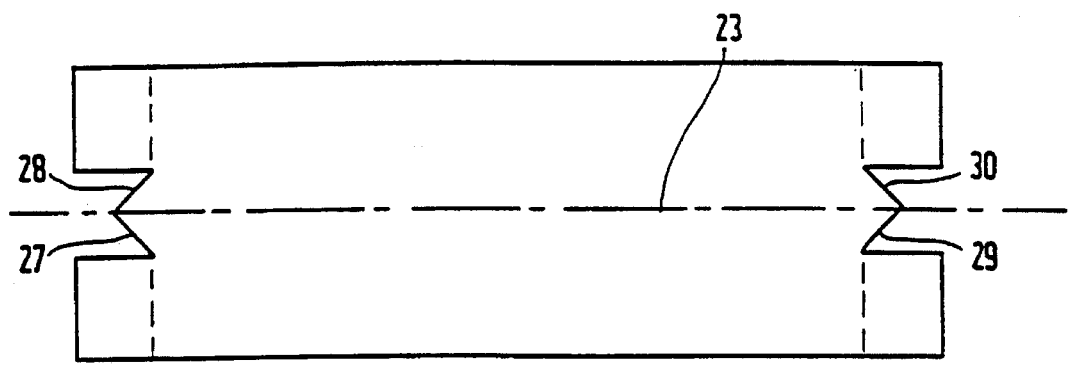

FIGS. 4c and 4d show a third and a fourth embodiment of the MMI coupler according to the invention. The two intermediate faces 17' and 21' in FIG. 4c are arranged obliquely with respect to the longitudinal axis 23 of the waveguide 14'''. If the intermediate face 17' is not imaged on the intermediate face 21' by the unwanted radiation modi, the resonant cavity constituted by the waveguide between these faces no longer complies with the resonance criteria and there will be little laser action in the waveguide. The same applies, if the intermediate faces consist of two faces 27, 28 and 29, 30 together forming a roof as is shown in FIG. 4d. The roofs as shown in FIG. 4d can be manufactured in a simpler manner than the known plane intermediate faces 17, 21 shown in FIG. 3a. In the embodiments shown in FIGS. 4c and 4d the normals of the oblique faces are in the plane of the drawing. However, the faces may be oblique to such an extent that their normals are no longer in the plane of the drawing.

If the faces 17', 21', 27–30 are sufficiently oblique, unwanted radiation modi are attenuated because the radiation incident on the faces is reflected in a direction in which no guided modi of the MMI waveguide can be generated. The reflection of the ends can also be reduced by roughening the parts of the ends of the MMI waveguide outside the windows so that there is no longer any specular reflection.

All the embodiments of the MMI coupler described with reference to FIG. 4 have a laser-active medium in the waveguide 14. However, the invention may also be used to great advantage in an MMI coupler in which no laser-active medium is present in the waveguide. In that case the reflection-reducing means according to the invention suppress those reflections in the waveguide which may give rise to an unwanted redistribution of radiation across the windows. A very small portion of the power applied to the input window 16 will only be reflected to the same window by an MMI component as shown in FIG. 3a having a length and width which is exactly equal to the design values. However, if due to manufacturing tolerances the length or width deviates, for example 5% from the design value, the power reflected by the MMI component to the window 16 will increase by a factor of 100. Several applications of MMI components require an exceptionally low reflection in the direction of an input window, for example application of an MMI component as a power combiner and use in coherence detection apparatuses.

Figure 5:
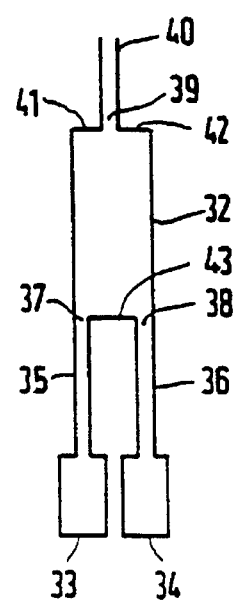
FIG. 5 shows an MMI coupler as a power combiner.

An example of the first-mentioned application is the combination of radiation powers from different lasers. FIG. 5 shows an MMI component in the form of a power combiner 32 which combines the radiation supplied by two lasers 33, 34. The lasers and the power combiner may be integrated on a single substrate. The radiation of the lasers is guided via two waveguides 35, 36 to the input windows 37, 38 of the power combiner. The power combiner has such a configuration that both the input window 37 and the input window 38 are imaged on one output window 39. The radiation powers applied to the input windows will thus be combined in the output window, from which a waveguide 40 further guides the powers. A small part of the radiation coming from the input windows will reach the surfaces 41, 42 alongside the output window 39. the conventional power combiner reflects this part of the radiation to the input windows where a part of this radiation is fed back to the lasers 33, 34 via the waveguides 35, 36. Such a feedback of radiation has a detrimental influence on the power and the spectrum of the lasers. DFB lasers axe so sensitive to feedback that a dual isolator having more than 60 dB isolation should be arranged between each laser and the power combiner when using conventional power combiners. The feedback strength is considerably reduced if the power combiner 32 is modified according to the invention, i.e. if the surfaces 41, 42 and 43 of the combiner axe made anti-reflecting or absorbing, or are arranged obliquely or formed as a roof.

Although the invention has been explained with reference to MMI components having two ends, it will be evident that the means for reducing reflection in an MMI coupler, such as shown in FIG. 4, can be used in all types of MMI components having one, two or more ends. This includes directional couplers, 90° hybrids, N×N power splitters, star couplers, N×N switches based on a Mach-Zehnder interferometer, multiplexers and demultiplexers.

We claim:

1. A multimode imaging component for dividing or coupling radiation, comprising a waveguide having an end which is provided with at least one window for transmitting radiation into or out of the waveguide, wherein the part of the end located outside the window is provided with means for reducing reflection of radiation in the direction of the longitudinal axis of the waveguide, wherein the part of the end located outside the window is arranged obliquely with respect to the longitudinal axis.

2. A multimode imaging component for dividing or coupling radiation, comprising a waveguide having an end which is provided with at least one window for transmitting radiation into or out of the waveguide, wherein the part of the end located outside the window is provided with means for reducing reflection of radiation in the direction of the longitudinal axis of the waveguide and the internal space of the waveguide comprises a laser-activatable medium.

3. A ring laser provided with a multimode imaging component for dividing or coupling radiation, comprising a waveguide having an end which is provided with at least one window for transmitting radiation into or out of the waveguide, wherein the part of the end located outside the window is provided with means for reducing reflection of radiation in the direction of the longitudinal axis of the waveguide.

4. The multimode imaging component as claimed in claim 2, wherein the means for reducing reflection of radiation in the direction of the longitudinal axis of the waveguide includes an anti-reflection coating.

5. The multimode imaging component as claimed in claim 2, wherein the means for reducing reflection of radiation in the direction of the longitudinal axis of the waveguide includes an absorbing coating.

6. The multimode imaging component as claimed in claim 2, wherein the means for reducing reflection of radiation in the direction of the longitudinal axis of the waveguide includes the part of the end located outside the window being arranged obliquely with respect to the longitudinal axis.

7. The ring laser as claimed in claim 3, wherein the means for reducing reflection of radiation in the direction of the longitudinal axis of the waveguide includes an anti-reflection coating.

8. The ring laser as claimed in claim 3, wherein the means for reducing reflection of radiation in the direction of the longitudinal axis of the waveguide includes an absorbing coating.

9. The ring laser as claimed in claim 3, wherein the means for reducing reflection of radiation in the direction of the longitudinal axis of the waveguide includes the part of the end located outside the window being arranged obliquely with respect to the longitudinal axis.

10. The ring laser as claimed in claim 3, wherein the internal space of the waveguide comprises a laser-activatable medium.

* * * * *